(12) United States Patent
Lyons (10) Patent No.: US 8,144,306 B2
(45) Date of Patent: Mar. 27, 2012

(54) REVERSE FLOW GAS GAUGE PROXIMITY SENSOR

(75) Inventor: Joseph H. Lyons, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 465 days.

(21) Appl. No.: 12/547,835

(22) Filed: Aug. 26, 2009

(65) Prior Publication Data

US 2010/0110399 A1    May 6, 2010

Related U.S. Application Data (60) Provisional application No. 61/111,132, filed on Nov. 4, 2008.

(51) Int. Cl.
*G03B 27/52* (2006.01)
*G03B 27/42* (2006.01)
(52) U.S. Cl. ............ 355/30; 355/53
(58) Field of Classification Search .......... 355/30, 355/53, 67; 356/399–401; 73/37.5
See application file for complete search history.

(56) References Cited

U.S. PATENT DOCUMENTS

| | | | |
|---|---|---|---|
| 3,942,556 | A | 3/1976 | Wojcikowski |
| 4,550,592 | A | 11/1985 | Dechape |
| 4,724,701 | A | 2/1988 | Mon |
| 4,953,388 | A | 9/1990 | Barada |
| 5,148,746 | A | 9/1992 | Fuller et al. |
| 7,010,958 | B2 | 3/2006 | Gajdeczko |
| 7,549,321 | B2 | 6/2009 | Kochersperger et al. |
| 2004/0040383 | A1 | 3/2004 | Banholzer et al. |
| 2010/0103399 | A1* | 4/2010 | Lyons et al. ............ 355/71 |
| 2010/0309445 | A1* | 12/2010 | Schultz ............ 355/30 |

FOREIGN PATENT DOCUMENTS

| | | |
|---|---|---|
| DE | 200 04 783 U1 | 8/2000 |
| DE | 10 2004 053 672 A1 | 5/2006 |
| EP | 0 811 826 A2 | 12/1997 |
| SU | 1714230 A1 | 2/1992 |
| SU | 1717868 A1 | 3/1992 |

OTHER PUBLICATIONS

English machine translation of DE 200 04 783 U1 published Aug. 10, 2000 (data supplied from the esp@cenet database).
English abstract of DE 10 2004 053 672 A1 published May 4, 2006 (data supplied from the esp@cenet database).
English abstract of SU 1714230 A1 published Feb. 23, 1992 (data supplied from the WPI database).
English abstract of SU 1717868 A1 published Mar. 7, 1992 (data supplied from the WPI database).

* cited by examiner

*Primary Examiner* — Hung Henry Nguyen
(74) *Attorney, Agent, or Firm* — Sterne, Kessler, Goldstein & Fox P.L.L.C.

(57) ABSTRACT

A gas gauge proximity sensor supplying gas in a reverse flow direction from the injection chamber to the measurement chamber. Supplying gas in a reverse flow direction enables the transient behavior in the sensor to more rapidly stabilize, with a resulting increase in bandwidth. Optionally, a scavenger chamber can be used to remove the excess gas by locating a scavenger aperture of the scavenger chamber in close proximity to the exit aperture of the injection chamber. A bridge proximity sensor can be used with a reference chamber to receive gas flow from a location close to the exit aperture of the injection chamber in order to reduce common mode errors.

20 Claims, 5 Drawing Sheets

REVERSE FLOW GAS GAUGE PROXIMITY SENSOR

CROSS REFERENCE TO RELATED APPLICATION(S)

This applications claims the benefit under 35 U.S.C. 119(e) to U.S. Provisional Application No. 61/111,132, filed Nov. 4, 2008, which is incorporated by reference herein in its entirety.

BACKGROUND

1. Field of the Invention

The present invention relates to a proximity sensor, and in particular to a proximity sensor for use in semiconductor lithographic applications.

2. Related Art

Many automated manufacturing processes require the sensing of the distance between a manufacturing tool and the product or material surface being worked upon. In some situations, such as semiconductor lithography, that distance must be measured with an accuracy approaching a nanometer.

The challenges associated with creating a proximity sensor of such accuracy are significant, particularly in the context of lithography systems. In the lithography context, in addition to the needs to be non-intrusive and to accurately detect very small distances, the proximity sensor cannot introduce contaminants or come in contact with the work surface, typically a semiconductor wafer. Occurrence of either situation may significantly degrade or ruin the quality of the material surface or product being worked upon.

Different types of proximity sensors are available to measure very small distances. Examples of such proximity sensors include capacitance gauges and optical gauges. However, these proximity sensors have serious shortcomings when used in lithographic projection systems because the physical properties of materials deposited on wafers may impact the accuracy of these sensors. For example, capacitance gauges, being dependent on the concentration of electric charges, can yield spurious proximity readings in locations where one type of material (e.g., metal) is concentrated. More generally, optical and capacitive methods are prone to errors due to significant interactions with layers beneath photoresist coatings. Another class of problem occurs when exotic wafers made of non-conductive and/or photosensitive materials, such as Gallium Arsenide (GaAs) and Indium Phosphide (InP), are used. In these cases, capacitance gauges and optical gauges may provide spurious results, and are therefore not optimal.

A typical gas gauge pressure sensor contains a reference nozzle and one or more measurement nozzles to emit a gas flow onto reference and measurement surfaces. Measurements are made of the back pressure differences within the sensors to determine the distance between the measurement nozzle and the measurement surface. Such a gas gauge pressure sensor is not vulnerable to concentrations of electric charges or to the electrical, optical or other physical properties of a wafer surface. A gas gauge pressure sensor detects only the top physical layer, and thereby yields a superior result. Accordingly, these types of gauges are ideal for topographic measurement of a material surface, such as that used to establish focus prior to lithographic exposure.

Speed of measurement is a critical performance driver in current semiconductor manufacturing processes. Specifically, increased bandwidth of proximity sensors is necessary to support current semiconductor manufacturing throughput practice. Traditional gas gauge proximity sensors use outward gas flows from which pressure changes are used to derive the desired proximity measurement. However, gas pressure fluctuations do not propagate rapidly in a direction against the gas flow, as is the case in a traditional gas gauge proximity sensor. The outward gas flows at the point of measurement affect the speed of propagation of the pressure changes. This resistance, and thereby the response time constant, increase when the proximity sensor uses lower pressures, or equivalently higher gas flow rates. In fact, operating conditions can result in the gas flow rate at the measurement nozzles approaching sonic conditions. Thus, the propagation of the pressure changes resulting from changes in the substrate surface in the vicinity of these measurement nozzles are significantly slowed by such a rapid outward gas flow. Accordingly, the response time and therefore the bandwidth potential of such proximity sensors suffer dramatically as a result of this physical phenomenon.

SUMMARY

Therefore, what is needed is an apparatus and method to provide a gas gauge proximity sensor with an increased response time and therefore bandwidth, without sacrificing the many benefits of proximity measurement using these types of sensors.

In one embodiment according to the present invention, an apparatus comprising a housing is provided. The apparatus includes an injection chamber within the housing. The injection chamber includes an exit aperture and a gas supply port, wherein the gas supply port may be configured to couple to a gas source to thereby supply a gas. The apparatus further includes a measurement chamber within the housing. The measurement chamber includes an entrance aperture and a gas vent port, wherein the entrance aperture may be adjacent to the exit aperture and the gas vent port may be configured to release gas from the measurement chamber. The apparatus further includes a pressure sensor coupled to the injection chamber and the measurement chamber. The pressure sensor may be configured to output a signal responsive to a difference in the pressure of gas in the injection chamber and the pressure of gas in the measurement chamber.

In another embodiment consistent with the present invention, a method is provided. The method includes supplying gas to an injection chamber via a gas supply port, wherein the injection chamber includes an exit aperture. The method further includes venting gas from a measurement chamber. The measurement chamber includes a gas vent port and an entrance aperture. The entrance aperture may be proximate to the exit aperture such that a portion of gas exiting from the exit aperture enters the entrance aperture, and the entrance aperture may be separated by a distance from a surface such that a pressure of gas in the measurement chamber may be responsive to the distance from the surface. The method further includes outputting a signal from a pressure sensor. The pressure sensor may be coupled to the injection chamber and the measurement chamber. The signal from the pressure sensor may be responsive to a difference in pressure between gas in the injection chamber and gas in the measurement chamber.

In one further embodiment in accordance with the present invention, a lithographic system is provided. The lithographic system comprises an illumination system configured to produce a beam of radiation. The lithographic system further comprises a support device configured to support a patterning device that may be capable of patterning the beam of radiation. The lithographic system further comprises a projection system configured to project the patterned beam onto a substrate. The lithographic system further includes a housing and an injection chamber within the housing. The injection chamber may include an exit aperture proximate to the substrate and a gas supply port, wherein the gas supply port may be configured to couple to a gas source to thereby supply a gas. The lithographic system further includes a measurement chamber within the housing. The measurement chamber includes an entrance aperture and a gas exhaust port, wherein the entrance aperture may be adjacent to the exit aperture and the gas vent port may be configured to release gas from the measurement chamber. The lithographic system further includes a pressure sensor coupled to the injection chamber and the measurement chamber. The pressure sensor may be configured to output a signal responsive to a difference in the pressure of the gas in the injection chamber and the pressure of the gas in the measurement chamber.

In yet one other embodiment according to the present invention, a proximity sensor includes a gas gauge configured to couple to a pressure sensor for enabling a topographic measurement of a material surface. The gas gauge comprises a housing, and an injection chamber within the housing. The injection chamber includes an exit aperture and a gas supply port, wherein the gas supply port is configured to couple to a gas source to thereby supply a gas. The proximity sensor further includes a measurement chamber within the housing. The measurement chamber includes an entrance aperture and a gas vent port, wherein the entrance aperture is adjacent to the exit aperture and the gas vent port is configured to release gas from the measurement chamber. The pressure sensor is configured to couple to the injection chamber and the measurement chamber such that the pressure sensor is capable of outputting a signal responsive to a difference in the pressure of gas in the injection chamber and the pressure of gas in the measurement chamber. The pressure drop from the injection chamber to the measurement chamber is a function of the proximity of the surface to be measured (e.g., wafer) to the proximity sensor.

In a further embodiment of the present invention, a proximity sensor is provided that couples a pressure sensor to a reverse flow gas gauge in order to enable high bandwidth proximity measurements. The proximity sensor comprises a measurement chamber and an injection chamber, with each chamber having an aperture that is located in close proximity to the other aperture. Both of these apertures are located in close proximity to the surface of a substrate of interest. The gas in the injection chamber is supplied by a gas source via a gas supply port. The gas exits from an exit aperture in the injection chamber that is located close to the surface of the substrate. A portion of that exiting gas, in turn, enters the measurement chamber via the entrance aperture due to the close proximity of the entrance aperture, the exit aperture and the surface of the substrate to each other. The proximity of the substrate surface to these apertures affects the gas flow rate, and thereby the gas pressure in the measurement chamber. The gas in the measurement chamber ultimately vents to the environment via a gas vent port. By connecting a pressure sensor to the measurement chamber and the injection chamber, the difference in pressure of the gas in the respective chambers can be determined. Reversing the gas flow from that found in the traditional gas gauge enables the transient behavior to more readily stabilize with the result that the response time (i.e., speed) of the proximity sensor is substantially enhanced. This is because pressure changes propagate with the flow of the gas, as opposed to against the flow in a traditional gas gauge.

In a further embodiment, a scavenger chamber is introduced to remove excess gas from the ambient environment. The scavenger chamber comprises a scavenger aperture that is located close to the entrance and exit apertures, with the exit aperture located in between the entrance aperture and the scavenger aperture. The scavenger chamber is coupled to a vacuum such that the excess gas is removed.

In various embodiments of the present invention, different gases can be used. Further, the apertures of the measurement chamber and injection chamber can be shaped in order to tailor the resulting gas flow conditions. For example, different aperture shapes and sizes can be used. In addition, the shape of the measurement chamber and the injection chamber can be any shape commensurate with the need to fulfill the functions described for these chambers. A typical shape for the measurement chamber is cylindrical. A typical shape for the injection chamber is annular. A typical shape for the optional scavenger chamber is also annular.

In a further embodiment of the present invention, different pressure sensors can be used. For example, a diaphragm-based sensor can be used with diaphragm movement sensed by any one of a number of different means including optical, inductive and capacitive sensing. Alternatively, the pressure sensor could be a non-diaphragm based pressure sensor, e.g., a restricted mass flow sensor.

In a further embodiment of the present invention, a bridge version of the proximity sensor can be used. In this embodiment, two arms, a measurement arm formed by a measurement chamber, and a reference arm formed by a reference chamber, are used to support a differential pressure measurement. Such a differential pressure measurement eliminates errors resulting from common mode effects, e.g., gas supply pressure variations.

Further embodiments, features, and advantages of the invention, as well as the structure and operation of the various embodiments of the invention are described in detail below with reference to the accompanying drawings.

BRIEF DESCRIPTION OF THE DRAWINGS/FIGURES

Embodiments of the present invention are described with reference to the accompanying drawings, which are incorporated herein and form a part of the specification and, together with the description, further serve to explain the principles of the invention and to enable a person skilled in the pertinent art to make and use the invention. In the drawings, like reference numbers indicate identical or functionally similar elements.

FIGS. 1A and 1B respectively depict reflective and transmissive lithographic apparatuses.

One or more embodiments of the present invention will now be described with reference to the accompanying drawings.

DETAILED DESCRIPTION

While the present invention is described herein with reference to illustrative embodiments for particular applications, it should be understood that the scope of the invention is not limited thereto. Those skilled in the art with access to the teachings provided herein will recognize additional modifications, applications, and embodiments within the scope thereof and additional fields in which the present invention would be of significant utility. The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1A:
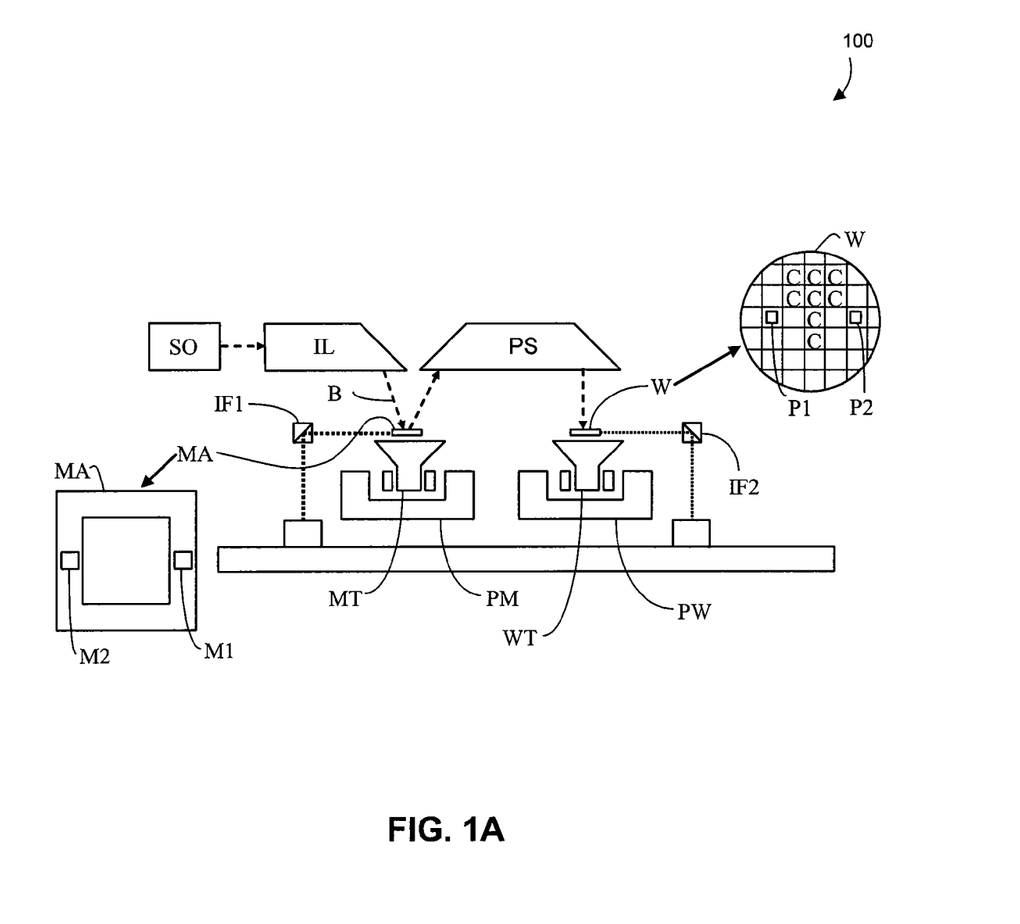
Figure 1B:
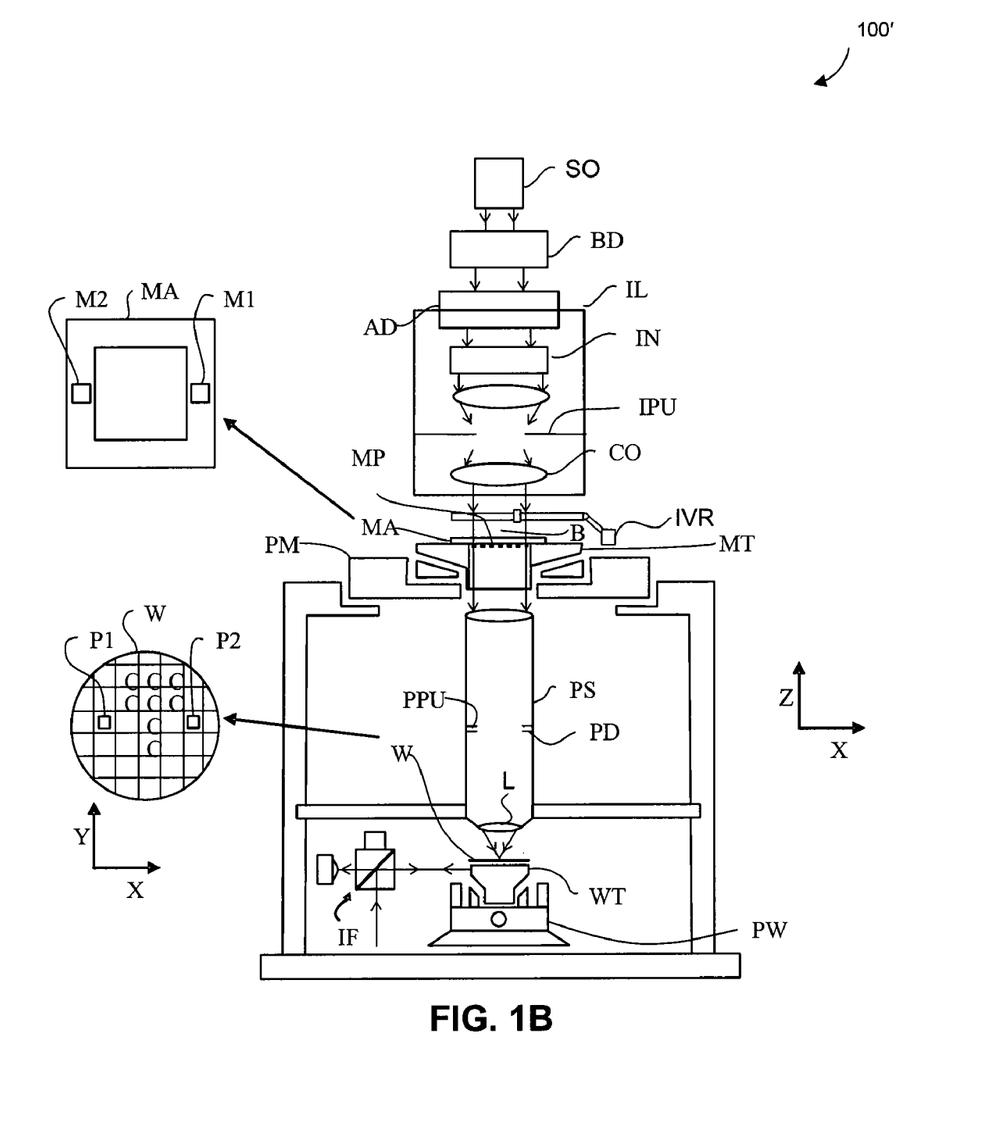

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure. When the preparatory steps can be performed while one or more other substrate tables WT are being used for exposure, the preparatory steps are said to occur during an "in-line phase" because the preparatory steps are performed within the desired throughput of the lithographic apparatus 100 and/or lithographic apparatus 100'. In contrast, when the preparatory steps cannot be performed while one or more other substrate tables WT are being used for exposure, the preparatory steps are said to occur during an "off-line phase" because the preparatory steps cannot be performed within a desired throughput of lithographic apparatus 100 and/or lithographic apparatus 100'. As described in more detail herein, focus-positioning parameters of an exposure system (such as, for example projection system PS of lithographic apparatuses 100, 100') may be determined in an off-line phase, an in-line phase, or a combination thereof.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes.

In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation (e.g., having a wavelength of 5 nm or above).

The term "lens," where the context allows, may refer to any one or combination of various types of optical components, including refractive and reflective optical components.

U.S. application Ser. Nos. 11/646,612 and 10/322,768 and U.S. Pat. Nos. 4,953,388 and 4,550,592, all of which are incorporated herein by reference in their entireties, disclose example alternative approaches to proximity sensing through using of a gas gauge pressure sensor.

Figure 2:
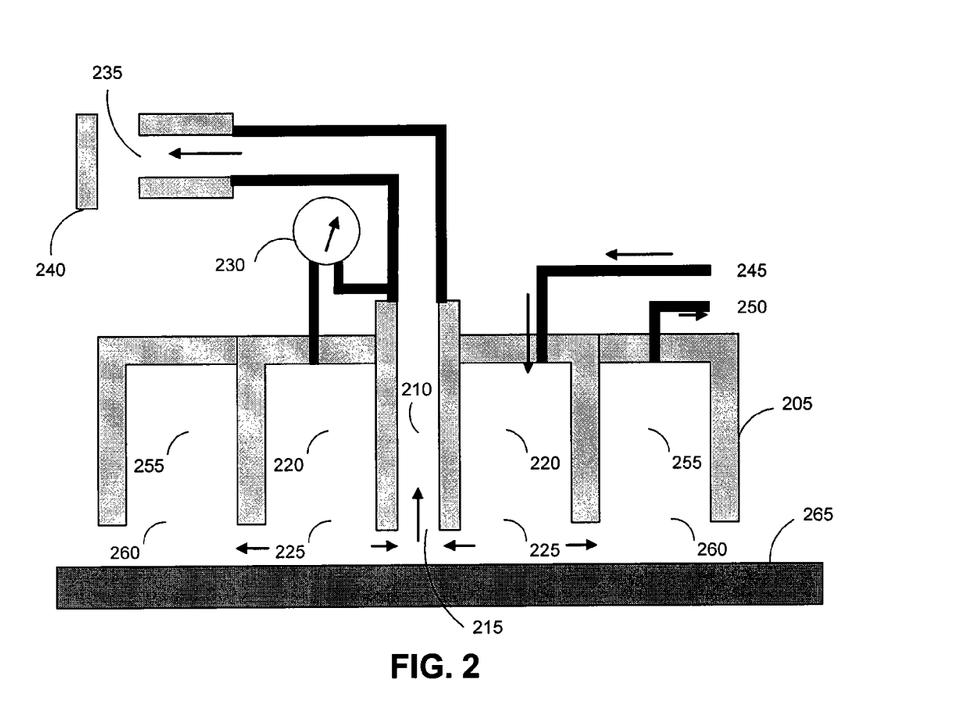
FIG. 2 is a diagram of a proximity sensor, according to an embodiment of the present invention.

FIG. 2 provides a diagram of a proximity sensor 200, in accordance with an embodiment of the present invention. Proximity sensor 200 comprises a housing 205 that includes two internal chambers: a measurement chamber 210 and an injection chamber 220. The measurement chamber 210 and the injection chamber 220 each comprises at least one aperture, an entrance aperture 215 in the measurement chamber 210, and an exit aperture 225 in the injection chamber 220. The entrance aperture 215 and the exit aperture 225 are located close to one another, and in close proximity to the surface of the substrate 265 under measurement. A gas source (not shown in FIG. 2) provides gas under pressure to the injection chamber 220 via at least one gas supply port 245. The gas exits from the injection chamber 220 via the exit aperture 225 and into the surrounding areas. A portion of the exiting gas flows into the measurement chamber 210 via the entrance aperture 215.

The measurement chamber 210 also comprises a gas vent port 235, which allows gas to vent from this chamber. Typically, the gas vent port 235 comprises some form of resistance to the release of gas from the measurement chamber 210 into the ambient surroundings. In one embodiment, the gas vent port 235 may be an aperture that may be located close to a standoff 240. In this embodiment, the amount of resistance varies with the distance of separation between the standoff 240 and the aperture. For example, a smaller separation provides a greater resistance to gas flow, while a larger separation provides a smaller resistance to gas flow. In another embodiment, a restrictor could be used within the gas vent port 235 to provide the required flow resistance. As noted above, the gas vent port 235 provides some form of resistance to the release of gas from the measurement chamber 210. Accordingly, the scope of the invention is not limited to the particular embodiments of the gas vent port 235 that have been described herein.

The resistance of the gas vent port 235 remains fixed and provides for a pressure drop from measurement chamber 210 to the ambient conditions. This pressure drop is a function of the inter-chamber resistance between injection chamber 220 and measurement chamber 210 via exit aperture 225 and entrance aperture 215. This inter-chamber resistance is a function of the gap formed to the surface of substrate 265, or the proximity distance being measured.

A pressure sensor 230 comprises two measurement points: one at the injection chamber 220 and the other at the measurement chamber 210. The pressure sensor 230 measures the pressure differential between its two measurement points, in this case the pressure difference between gas in the injection chamber 220 and gas in the measurement chamber 210. These measurement points may be located anywhere in each of their respective chambers. In one embodiment of the present invention, a desired position for these measurement points may be a position that is distant from both the supply points and the exit points of gas flow so that the gas flow is relatively stable and therefore the pressure measurement is relatively stable. This stable gas flow condition permits the proximity of the entrance aperture 215 to the surface of the substrate 265 to be imputed from a measurement of the pressure within the measurement chamber 210, in accordance with the following principles.

Under steady state conditions, a simple relationship exists between the resulting pressure of gas in the measurement chamber 210 and the distance between the entrance aperture 215 and the nearby surface of the substrate 265. In a typical scenario, a low speed gas flow moves from the injection chamber 220 to the measurement chamber 210, where the gas flow rate may be limited by the restriction provided by the proximity of the surface of the substrate 265 to the exit and entrance apertures 225 and 215. Unlike the gas entering the entrance aperture 215, a higher speed gas flow moves from the injection chamber 220 to the surrounding ambient areas. Under certain conditions, this higher speed gas flow can potentially reach a shock wave condition. However, such conditions as well as any changes in the constriction of gas flow going from the injection chamber 220 to the surrounding ambient area (versus entering the measurement chamber 210) are common mode to the two measured pressure conditions, namely the pressure of the gas in the measurement chamber 210 and the pressure of the gas in the injection chamber 220. Accordingly, such common mode conditions will not be measured by the pressure sensor 230 since its output is responsive to the difference in the two measurement points.

In a further embodiment of the present invention, an optional scavenger subsystem can be included, as shown in FIG. 2. Such a subsystem seeks to reduce the exodus of gas into the surrounding areas when such gas outflows are deemed excessive. In such an embodiment, the housing 205 comprises an additional chamber, a scavenger chamber 255. The scavenger chamber 255 comprises a scavenger aperture 260 that may be located in close proximity to the exit aperture 225, with the exit aperture 225 located between the scavenger aperture 260 and the entrance aperture 215. A vacuum source (not shown in FIG. 2) may be connected to the scavenger chamber 255 via a gas exhaust port 250. Excess gas that exits via the exit aperture 225 may be drawn into the scavenger chamber 255 via the scavenger aperture 260. Such excess gas may be in turn captured by the vacuum source via at least one gas exhaust port 250.

A wide set of gases can be used in the present invention, subject to the requirement to be inert (and thereby not interact with the surface of the substrate 265 whose topology is undergoing scrutiny). Examples of a gas suitable for use with the present invention include but are not limited to air, hydrogen and nitrogen.

In alternative embodiments of the present invention, different implementations of the pressures sensor 230 are within the scope of the subject matter described herein. For example, the pressure sensor 230 can be a diaphragm-based pressure sensor, in which the diaphragm moves in response to the applied pressure. Various types of diaphragm-based pressure sensors are applicable here, including those sensors that differentiate themselves based on the means of detection of diaphragm movement, such as optical, capacitive, piezoresistive and inductive transducers. Other possibilities for the pressure sensor 230 include, e.g., a restricted mass flow meter. Representative commercial examples of such pressures sensors are a Honeywell AWM3300V.

In a further embodiment of the present invention, the measurement chamber 210 and the injection chamber 220 may comprise various shapes. Although FIG. 2 suggests a cylindrical shape for the measurement chamber 210 and an annular cylindrical shape for the injection chamber 220, embodiments of the present invention are not limited to this shape. Indeed, any shape that permits the location of the various parts described earlier is within the scope of the present invention. Specifically, the measurement chamber 210 can be any shape that enables the entrance aperture 215 and the gas vent port 235 and their associated functions to be accommodated. Similarly, the injection chamber 220 can be any shape that enables the exit aperture 225 and the gas supply port 245 and their functions to be accommodated. Similarly, although FIG. 2 suggests an annular shape for the scavenger chamber 255, embodiments of the present invention are not limited to this shape. In fact, the scavenger chamber 255 can be any shape that enables the scavenger aperture 260 and the gas exhaust port 250 and their associated functions to be accommodated.

Figure 3:
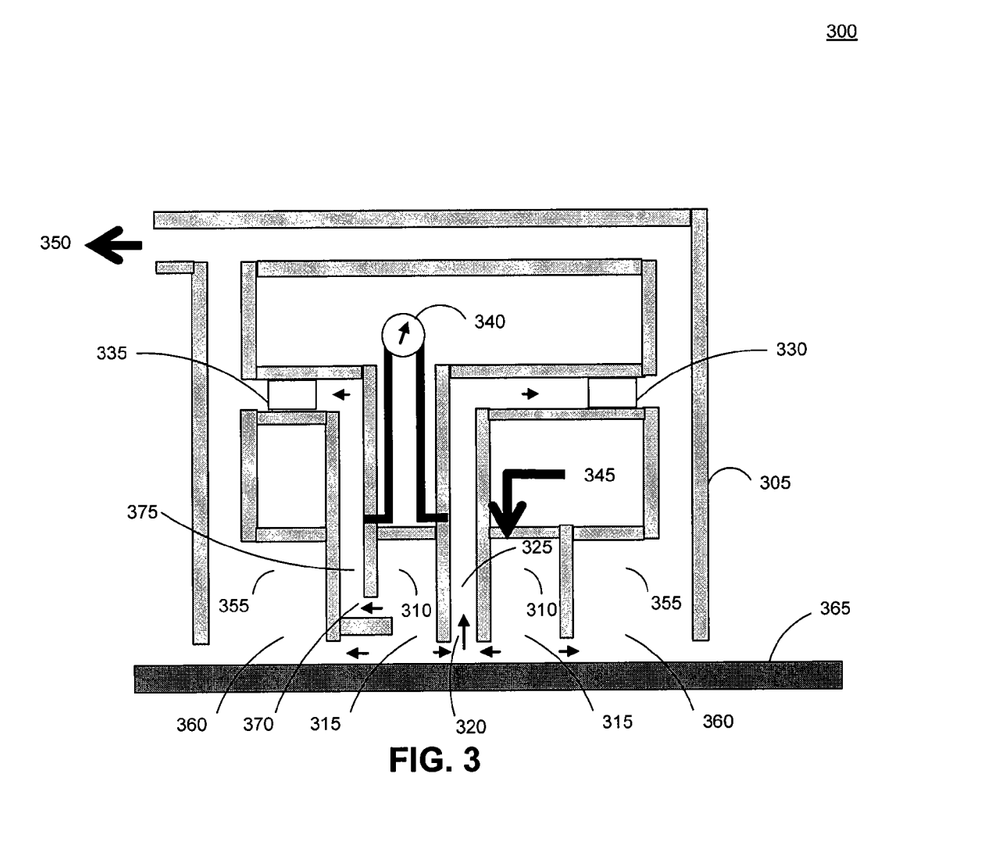
FIG. 3 is a diagram of a bridge-type proximity sensor, according to an embodiment of the present invention.

FIG. 3 provides a diagram of a bridge-version of a proximity sensor 300, in accordance with an embodiment of the present invention. Proximity sensor 300 comprises a housing 305 that includes three chambers: an injection chamber 310, a measurement chamber 325 and a reference chamber 375. As before, the measurement chamber 325 and the injection chamber 310 each has an aperture. The measurement chamber 325 comprises an entrance aperture 320, while the injection chamber 310 comprises an exit aperture 315. The entrance aperture 320 and the exit aperture 315 are located close to one another, and in close proximity to the surface of the substrate 365 that is undergoing scrutiny. As in the embodiment of FIG. 2, a gas source (not shown in FIG. 3) provides gas under pressure to the injection chamber 310 via a gas supply port 345. The gas exits from the injection chamber 310 via the exit aperture 315 and into the surrounding areas. A portion of the gas flows into the measurement chamber 325 via the entrance aperture 320. The gas may be vented from the measurement chamber 325 to a vacuum source (not shown in FIG. 3) via at least one gas vent port 330 and gas exhaust port 350. The additional reference chamber 375 comprises a reference aperture 370 that receives gas from the injection chamber 310. Reference chamber 375 also comprises reference port 335 to vent gas via gas exhaust port 350. The location of the reference aperture 370 may be in any location consistent with the ability for gas to flow from the injection chamber 310 to the reference chamber 375. However, a desired location would be one that places the reference aperture 370 relatively close to the exit aperture 315 such that as many common mode influences are captured by the bridge as is practical, and thereby eliminated.

The resistances of the venting elements (gas vent port 330 and reference port 335) remain fixed and provide for pressure drops from measurement chamber 325 and reference chamber 375 to the ambient conditions via gas exhaust port 350. In measurement chamber 325, the pressure drop is a function of the pressure in injection chamber 310 and the inter-chamber resistance between injection chamber 310 and measurement chamber 325 via exit aperture 315 and entrance aperture 320. This inter-chamber resistance is a function of the gap formed to the surface of substrate 365, or the proximity distance being measured. In the reference chamber 375, the pressure drop is simply a function of the pressure in the injection chamber 310 and the resistance of reference aperture 370, which remains fixed.

A pressure sensor 340 comprises two measurement points: one at the reference chamber 375 and the other at the measurement chamber 325. The pressure sensor 340 measures the pressure differential between its two measurement points. In this case, the pressure difference between gas in the reference chamber 375 and gas in the measurement chamber 325. These measurement points may be located anywhere in each of their respective chambers. As before, the desired position for these measurement points may be a position that is distant from both the supply points and the exit points of gas flow so that the gas flow is relatively stable and therefore the pressure measurement is relatively stable.

By way of example, an operating point for an embodiment of the present invention under ambient conditions can be as follows. Gas is supplied at a rate of approximately 400 sccm (standard cubic centimeters per minute) to the proximity sensor, or, in the case of a bridge version of the proximity sensor, roughly twice that supply rate (i.e., 800 sccm). Should restrictors be used, the restrictors can provide a pressure drop of approximately 10 kPa in the system. The exit aperture 225 and entrance aperture 215 each would be approximately 2 mm in diameter, and located approximately 100 μm from the surface of the substrate 265. Operating point parameters can change based on many factors including, but not limited to, ambient pressure, optimization requirements, and type of gas used. Simulations indicate that response time improvements of up to 25% may be achieved using a reverse flow gas gauge proximity sensor over that available to a comparable forward flow gas gauge proximity sensor.

In a further embodiment of the present invention, an optional scavenger subsystem can be included, as shown in FIG. 3. As before, such a subsystem seeks to reduce the exodus of gas into the surrounding areas when such gas outflows are deemed excessive. In such an embodiment, the housing 305 comprises an additional chamber, a scavenger chamber 355. The scavenger chamber 355 comprises a scavenger aperture 360 that may be located in close proximity to the entrance aperture 320 and the exit aperture 315, with the exit aperture 315 located between the scavenger aperture 355 and the entrance aperture 320. A vacuum source (not shown in FIG. 3) may be connected to the scavenger chamber 355 via a gas exhaust port 350. Excess gas that exits via the exit aperture 315 may be drawn into the scavenger chamber 355 via the scavenger aperture 360. Such excess gas may be in turn captured by the vacuum source via the gas exhaust port 350.

As before, a wide set of gases can be used in the bridge version of the present invention, subject to the requirement to be inert (and thereby not interact with the surface of the substrate 365 whose topology is undergoing scrutiny). Examples of a gas suitable for use with the present invention include but are not limited to air, hydrogen and nitrogen.

As before, in alternative embodiments of the bridge version of the present invention, different implementations of the pressures sensor 340 are within the scope of the subject matter described herein. For example, the pressure sensor 340 can be a diaphragm-based pressure sensor, in which the diaphragm moves in response to the applied pressure. Various types of diaphragm-based pressure sensors are applicable here, including those sensors that differentiate themselves based on the means of detection of diaphragm movement, such as optical, capacitive, piezoresistive, and inductive transducers. Other possibilities for the pressure sensor 340 include, e.g., a restricted mass flow meter. Representative commercial examples of such pressures sensors are a Honeywell AWM3300V.

In a further embodiment of the present invention, the measurement chamber 325, the reference chamber 375 and the injection chamber 310 may comprise various shapes. Although FIG. 3 suggests a cylindrical shape for the measurement chamber 325, an annular cylindrical shape for the injection chamber 310, and a partial annular cylindrical shape for the reference chamber 375, embodiments of the present invention are not limited to this shape. Indeed, any shape that permits the location of the various parts described earlier is within the scope of the present invention. Specifically, the measurement chamber 325 can be any shape that enables the entrance aperture 320 and the gas vent port 330 and their associated functions to be accommodated. Similarly, the injection chamber 310 can be any shape that enables the exit aperture 315 and the gas supply port 345 and their functions to be accommodated. In the same way, the reference chamber 375 can be any shape that enables the reference aperture 370 and the reference port 335 and their functions to be accommodated. Similarly, although FIG. 3 suggests an annular shape for the scavenger chamber 355, embodiments of the present invention are not limited to this shape. In fact, the scavenger chamber 355 can be any shape that enables the scavenger aperture 360 and the gas exhaust port 350 and their associated functions to be accommodated.

Figure 4:
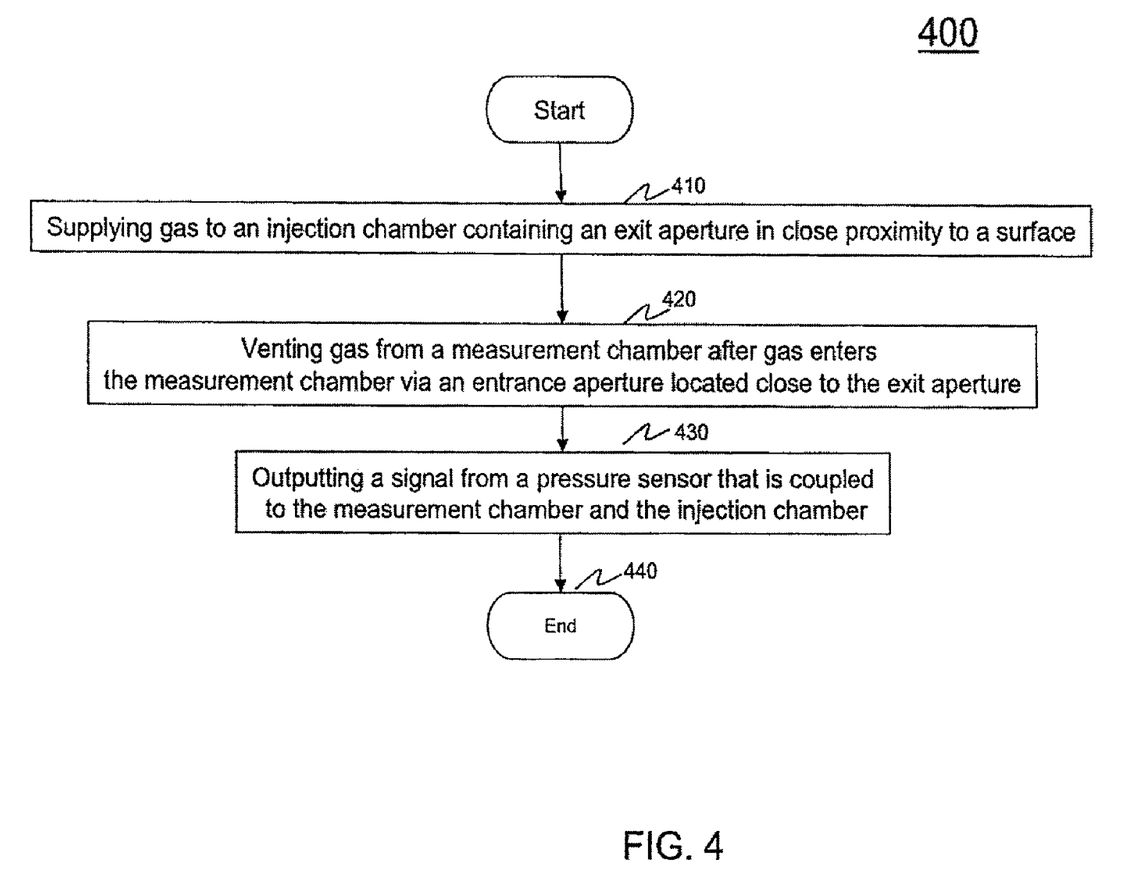
FIG. 4 provides a flowchart of a method that uses a reverse flow gas gauge to measure proximity to a nearby surface based on a pressure sensor, according to an embodiment of the present invention.

FIG. 4 provides a flowchart of a method 400 that uses a reverse flow gas gauge connected to a pressure sensor to make proximity measurements with a rapid response time. For convenience, method 400 is described with respect to proximity sensor 200. However, method 400 is not necessarily limited by the structure of proximity sensor 200, and can be implemented with a proximity sensor with a different structure.

The process begins at step 410. In step 410, gas may be supplied to an injection chamber having an exit aperture in close proximity to a substrate. For example, gas can be supplied under pressure to the injection chamber 220 from a gas source via at least gas supply port 245. The exit aperture 225 may be located in close proximity to the surface of the substrate 265.

In step 420, gas may be vented from a measurement chamber after entering the measurement chamber via an entrance aperture located in close proximity to the exit aperture. For example, gas flows into the measurement chamber 210 via the entrance aperture 215, after having previously exited from the injection chamber 220 via the exit aperture 225. Gas vents from the measurement chamber 210 via at least a gas vent port 235. The gas vent port 235 can be an aperture that may be located close to a standoff 240. Alternatively, the gas vent port 235 can be a restrictor. Other means of providing resistance to gas flow can be used for a gas vent port 235, and are within the scope of the present invention.

In step 430, a signal from a pressure sensor may be output, wherein the pressure sensor is coupled to the measurement chamber and the injection chamber. For example, a pressure sensor 230 comprising two measurement points can be used, with one measurement point at the injection chamber 220 and the other measurement point at the measurement chamber 210.

At step 440, method 400 ends.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus, comprising:
   a housing;
   an injection chamber within the housing, the injection chamber including an exit aperture and a gas supply port, the gas supply port is configured to couple to a gas source to thereby supply a gas;
   a measurement chamber within the housing, the measurement chamber including an entrance aperture and a gas vent port, the entrance aperture is adjacent to the exit aperture and the gas vent port is configured to release gas from the measurement chamber; and
   a pressure sensor coupled to the injection chamber and the measurement chamber, the pressure sensor is configured to output a signal responsive to a difference in the pressure of gas in the injection chamber and the pressure of gas in the measurement chamber.

2. The apparatus of claim 1, wherein at least one of the gas is one of air, hydrogen and nitrogen or the measurement chamber is cylindrical.

3. The apparatus of claim 1, wherein:
   the measurement chamber is cylindrical having a first longitudinal axis;
   the injection chamber is annular having a second longitudinal axis; and
   the first and second longitudinal axes are co-linear with each other.

4. The apparatus of claim 1, further comprising:
   a scavenger chamber within the housing, the scavenger chamber including a scavenger aperture and a gas exhaust port,
   wherein the scavenger aperture is adjacent to the entrance aperture with the entrance aperture between the scavenger aperture and the exit aperture, and
   wherein the gas exhaust port is configured to couple to a vacuum source to thereby withdraw gas from the scavenger chamber.

5. The apparatus of claim 1, wherein the injection chamber is configured to supply a desired portion of gas in a flow direction towards the measurement chamber to establish an upstream flow of gas therein, in response to receiving a controlled gas flow based on a predefined gas flow rate.

6. A method, comprising:
   supplying gas to an injection chamber via a gas supply port, the injection chamber includes an exit aperture;
   venting gas from a measurement chamber, the measurement chamber includes a gas vent port and an entrance aperture, the entrance aperture is proximate to the exit aperture, such that a portion of gas exiting from the exit aperture enters the entrance aperture, and the entrance aperture is separated by a distance from a surface, such that a pressure of gas in the measurement chamber is responsive to the distance from the surface; and
   outputting a signal from a pressure sensor, the pressure sensor is coupled to the injection chamber and the measurement chamber, and the signal is responsive to a difference in pressure between gas in the injection chamber and gas in the measurement chamber.

7. The method of claim 6, wherein:
   the measurement chamber is cylindrical having a first longitudinal axis;
   the injection chamber is annular having a second longitudinal axis; and
   the first and second longitudinal axes are co-linear with each other.

8. The method of claim 6, further comprising:
   withdrawing gas from a scavenger chamber,
   wherein the scavenger chamber includes a scavenger aperture and a gas exhaust port, wherein the scavenger aperture is adjacent to the entrance aperture with the entrance aperture between the scavenger aperture and the exit aperture, and
   wherein the gas exhaust port is configured to couple to a vacuum source to thereby withdraw gas from the scavenger chamber.

9. The method of claim 8, wherein:
   the measurement chamber is cylindrical having a first longitudinal axis;

the injection chamber is annular having a second longitudinal axis; and the scavenger chamber is annular having a third longitudinal axes, the first, second and third longitudinal axes are co-linear with each other.

10. The method of claim 6, further comprising:

receiving in the injection chamber a controlled gas flow based on a predefined gas flow rate for supplying a desired portion of gas from the injection chamber in a flow direction towards the measurement chamber to establish an upstream flow of gas therein.

11. The method of claim 6, further comprising:

providing a topographic measurement of the surface for use in semiconductor lithography based on the signal responsive to the difference in the pressure of gas in the injection chamber and the pressure of gas in the measurement chamber.

12. A lithographic system, comprising:

a support device configured to support a patterning device that is capable of patterning a beam of radiation;

a projection system configured to project the patterned beam onto a substrate;

a housing;

an injection chamber within the housing, the injection chamber including an exit aperture proximate to the substrate and a gas supply port, the gas supply port is configured to couple to a gas source to thereby supply a gas;

a measurement chamber within the housing, the measurement chamber including an entrance aperture and a gas exhaust port, the entrance aperture is adjacent to the exit aperture and the gas vent port is configured to release gas from the measurement chamber; and a pressure sensor coupled to the injection chamber and the measurement chamber, the pressure sensor is configured to output a signal responsive to a difference in the pressure of the gas in the injection chamber and the pressure of the gas in the measurement chamber.

13. The lithographic system of claim 12, wherein:

the measurement chamber is cylindrical having a first longitudinal axis; and the injection chamber is annular having a second longitudinal axis; and the first and second longitudinal axes are co-linear with each other.

14. The lithographic system of claim 12, further comprising:

a scavenger chamber within the housing, the scavenger chamber including a scavenger aperture and a gas exhaust port, wherein the scavenger aperture is adjacent to the entrance aperture with the entrance aperture between the scavenger aperture and the exit aperture, and wherein the gas exhaust port is configured to couple to a vacuum source to thereby withdraw gas from the scavenger chamber.

15. The lithographic system of claim 12, wherein the injection chamber is configured to supply a desired portion of gas in a flow direction towards the measurement chamber to establish an upstream flow of gas therein, in response to receiving a controlled gas flow based on a predefined gas flow rate.

16. A proximity sensor including a gas gauge configured to couple to a pressure sensor for enabling a topographic measurement of a material surface, the gas gauge comprising:

a housing; and an injection chamber within the housing, the injection chamber including an exit aperture and a gas supply port, wherein the gas supply port is configured to couple to a gas source to thereby supply a gas;

a measurement chamber within the housing, the measurement chamber including an entrance aperture and a gas vent port, the entrance aperture is adjacent to the exit aperture and the gas vent port is configured to release gas from the measurement chamber, the pressure sensor is configured to couple to the injection chamber and the measurement chamber such that the pressure sensor is capable of outputting a signal responsive to a difference in the pressure of gas in the injection chamber and the pressure of gas in the measurement chamber.

17. The proximity sensor of claim 16, wherein the injection chamber is configured to supply a desired portion of gas in a flow direction towards the measurement chamber to establish an upstream flow of gas therein, in response to receiving a controlled gas flow based on a predefined gas flow rate.

18. The proximity sensor of claim 16, wherein the signal responsive to a difference in the pressure of gas in the injection chamber and the pressure of gas in the measurement chamber to provide a topographic measurement of a material surface associated with semiconductor lithography.

19. An apparatus, comprising:

a housing;

an injection chamber within the housing, the injection chamber including an exit aperture and a gas supply port, wherein the gas supply port is configured to couple to a gas source to thereby supply a gas;

a measurement chamber within the housing, the measurement chamber including an entrance aperture and a gas vent port, the entrance aperture is adjacent to the exit aperture and the gas vent port is configured to release gas from the measurement chamber;

a reference chamber within the housing, the reference chamber including a reference aperture and a reference port, the reference aperture is interposed between the reference chamber and the injection chamber, and the reference port is configured to release gas from the reference chamber; and a pressure sensor coupled to the reference chamber and the measurement chamber, the pressure sensor is configured to output a signal responsive to a difference in the pressure of gas in the reference chamber and the pressure of gas in the measurement chamber.

20. The apparatus of claim 19, further comprising:

a scavenger chamber within the housing, the scavenger chamber including a scavenger aperture and a gas exhaust port, wherein the scavenger aperture is adjacent to the entrance aperture with the entrance aperture between the scavenger aperture and the exit aperture, and wherein the gas exhaust port is configured to couple to a vacuum source to thereby withdraw gas from the scavenger chamber.

* * * * *